United States Patent [19]

Mahmud

[11] Patent Number: 4,633,098
[45] Date of Patent: Dec. 30, 1986

[54] FLIP-FLOP CIRCUIT WITH BUILT-IN ENABLE FUNCTION

[75] Inventor: Syed T. Mahmud, Los Gatos, Calif.

[73] Assignee: Signetics Corporation, Sunnyvale, Calif.

[21] Appl. No.: 736,045

[22] Filed: May 20, 1985

[51] Int. Cl.$^4$ ............................................. H03K 3/356
[52] U.S. Cl. ................................ 307/279; 307/247 R;
 307/288; 307/291; 307/200 B
[58] Field of Search .................. 307/279, 247 R, 291,
 307/288, 200 B; 377/104, 105, 120, 121

[56] References Cited

U.S. PATENT DOCUMENTS

| | | | |
|---|---|---|---|
| 3,267,295 | 8/1966 | Zuk | 307/279 |
| 3,624,423 | 11/1971 | Borgini | 307/279 |
| 3,935,475 | 1/1976 | Margolies | 307/279 X |
| 3,993,919 | 11/1976 | Cox et al. | 307/279 |
| 4,224,533 | 9/1980 | Lai | 307/279 X |
| 4,300,060 | 11/1981 | Yu | 307/279 X |
| 4,333,020 | 6/1982 | Maeder | 307/279 |
| 4,356,411 | 10/1982 | Suzuki et al. | 307/279 X |

Primary Examiner—Larry N. Anagnos
Attorney, Agent, or Firm—Jack E. Haken; James J. Cannon, Jr.

[57] ABSTRACT

A flip-flop with a built-in enable function realized by the addition of two transistors between the trigger circuit and the output nodes of the flip-flop. This embodiment of the enable function causes no increase in power dissipation and may be used in any type of flip-flop.

1 Claim, 3 Drawing Figures

FLIP-FLOP CIRCUIT WITH BUILT-IN ENABLE FUNCTION

BACKGROUND OF THE INVENTION

1. Field of the Invention

This invention pertains to integrated circuits using MOS or CMOS circuitry and in particular to a flip-flop circuit having a built-in enable function in a minimum size implementation and no increase in power dissipation.

2. Description of the Prior Art

In many application a shift register, or a counter, or a flip-flop, needs to be maintained in its present state for a certain number of clock cycles determined by the length of an enable signal, E. In the prior art, this has required the addition of extra gating or a stopping of the local clock. Extra gating takes up more area on the surface of an integrated circuit and in many cases dissipates additional power. Stopping the local clock is generally not a good practice because it introduces clock skew between the local clock and the system clock.

An example of gating can be found in U.S. Pat. No. 3,993,919.

An example of a single flip-flop integrated with circuitry which enables the single flip-flop to be triggered by each of several individual clocked functions without interfering with one another is disclosed in U.S. Pat. No. 4,224,533. The flip-flop of this patent has a double stack of transistors in its trigger circuit and an asynchronous clock.

SUMMARY OF THE INVENTION

The present invention pertains to a flip-flop circuit with a built-in enable function in a minimum size implementation, the enable function causing no increase in power dissipation. This implementation is applicable to both NMOS and CMOS technologies. The invention implements the enable function with the addition of two transistors in the trigger circuit of an existing flip-flop. It is general purpose, applicable to any type of flip-flop.

In a standard S-R type flip-flop, during one clock cycle the S and R inputs are sampled and stored on storage nodes. Four transistors form a cross-coupled latch which provides the memory of the flip-flop between two clock edges. When the enable signal is on and the next clock transition occurs, the flip-flop switches according to the values stored. As long as the enable switch is on, the flip-flop functions normally, sampling at one clock time and switching to a new state at the rising edge of the next clock signal to form an edge triggered S-R flip-flop.

For the present invention, the enable function does not come from external logic, but rather from a pair of transistors which are inserted between the trigger circuit and the output nodes of the flip-flop. These transistors need not be very large. They only need to be large enough to make the output node dip low enough so that one of the nodes rising can latch through two of the transistors in the cross-coupled latch, which transistors are normal ratio devices. When it is desired to freeze the flip-flop in its new state, the enable input from these transistors is taken to zero (0) at any time after the clock signal has gone to a one (1) after satisfying a certain setup time. The setup time will guarantee that the flip-flop will switch to a stable state before the enable signal goes off. As long as the enable signal stays off, the flip-flop will retain its current state regardless of the number of clock edges. When it is desired to resume normal operation, the enable signal can be turned on at any time.

The result is a very simplified circuit which can operate without any increase in power dissipation, and is applicable to any type of flip-flop.

DESCRIPTION OF THE PREFERRED EMBODIMENT

Figure 1:
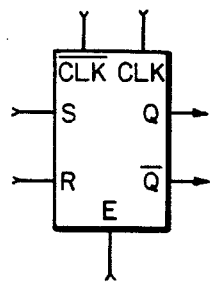
FIG. 1 is a logic symbol for an S-R type flip-flop.
Figure 2:
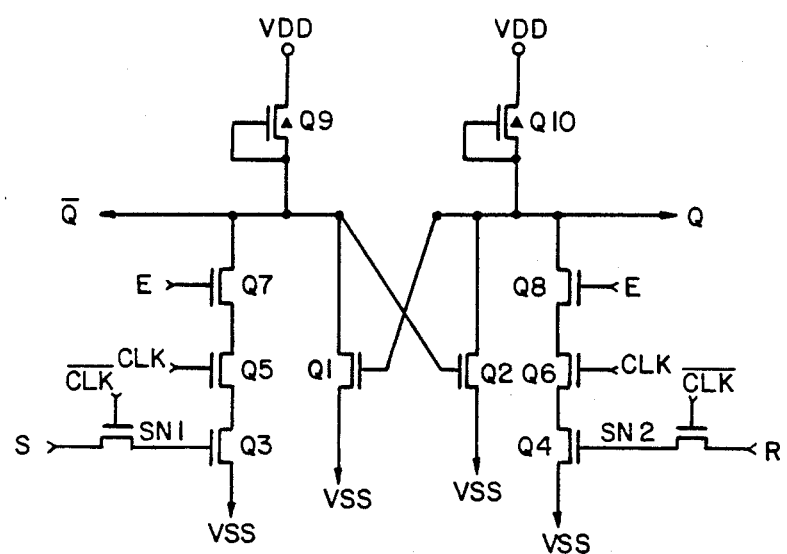
FIG. 2 is a circuit diagram of the S-R flip-flop shown in FIG. 1, with the addition of the enable function of the present invention.

FIG. 1 shows a logic symbol for an S-R type flip-flop, and FIG. 2 shows the corresponding circuit diagram, including the enable function of the present invention. In the figure, a triangle in the transistor symbol denotes a depletion mode device. All other transistors are enhancement mode devices. Referring now to FIG. 2, when $\overline{CLK}$ is high, the S and R inputs are sampled and stored on the storage nodes SN1 and SN2. CLK and $\overline{CLK}$ are non-overlapping clocks. Transistors Q1, Q2, Q9 and Q10 form a cross-coupled latch which provides the memory of the flip flop between two CLK edges.

The enable function is provided by the addition of transistors Q7 and Q8 between the trigger circuit and the outputs of this S-R flip-flop. Assuming the enable input E is 1, when $\overline{CLK}$ goes to 0 and CLK goes to 1, the flip-flop switches according to the values stored on SN1 and SN2. As long as E is 1, the flip-flop functions normally, that is sampling at $\overline{CLK}$ time and switching to a new state at the rising edge of CLK to form an edge triggered S-R flip-flop.

Q7 and Q8 need not be very large to implement the enable function. They need only be large enough to make the outputs Q or $\overline{Q}$ dip low enough so that one of Q or $\overline{Q}$ rising can latch through Q1 or Q2 which are normal ratio devices.

When it is desired to freeze this flip-flop in its new state, the E input should be taken to 0 at any time after CLK has gone to a 1, after satisfying a certain setup time. This setup time will guarantee that the flip-flop will switch to a stable state before E goes to 0. As long as E stays at 0, the flip-flop will retain its current state regardless of the number of CLK edges.

When it is desired to resume normal operation of the flip-flop, the enable input E can be brought back to 1 at any time. For this operation, there are two cases to consider. The enable input E goes to 1 when:

(a) $\overline{CLK}$ is high. In this case, CLK is the triggering edge.

(b) CLK is high. In this case, since the CLK edge has already occurred, and SN1 and SN2 still store the sampled values, the rising edge of the enable input forms the triggering edge.

The second case shows that the flip-flop switching time can be modulated depending on when the rising edge of the enable signal occurs during CLK high time.

Figure 3:
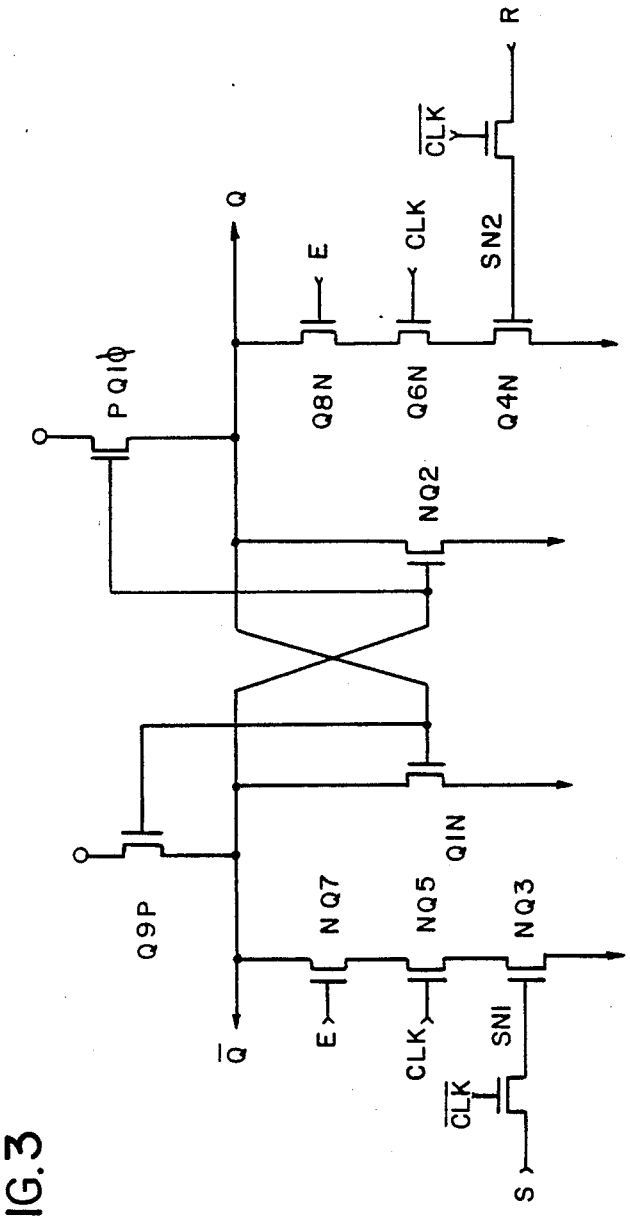
FIG. 3 is a CMOS version of the circuit of FIG. 2.

FIG. 3 illustrates an implementation of the circuit of the present invention in CMOS technology. In this implementation, Q9 and Q10 will be P-channel transistors.

This implementation of the enable function in a flip flop circuit is completely general and can be achieved in an S-R, a D, a T, or a JK type of flip-flop with a clear, a preset or both.

What is claimed is:

1. A flip-flop with a built-in enable function whereby said flip-flop can maintain its state through a number of clock cycles determined by an enable signal, comprising:
   (a) a flip-flop having trigger means with clock inputs responsive to clock signals and having set and reset inputs so that during the application of a set signal to a set input, the occurrence of a first low to high logic level transition of a clock signal applied to a clock input will set said flip-flop to one state and during the application of a reset signal to said reset input, the occurrence of a second low to high logic level transition of said clock signal will set said flip-flop to another state opposite to said one state;
   (b) said flip-flop having two complementary output nodes connected to said trigger means, a first one of said output nodes for setting said flip-flop in response to a set input and a second one of said output nodes for resetting said flip-flop in response to a reset input;
   (c) said flip-flop having a first transistor responsive to said clock signal and a second transistor in series with said first transistor responsive to said set or reset signal; and
   (d) a third transistor, responsive to the logic level at an enable input, coupled between said second transistor and an output node to prevent clock pulses from triggering said flip-flop by disconnecting said second transistor from said output node during the time period between at least two successive low to high logic level transitions of said clock signal, whereby said flip-flop can be prevented from switching during said time period.

* * * * *